US008760955B2

(12) United States Patent
Liao et al.

(10) Patent No.: US 8,760,955 B2
(45) Date of Patent: Jun. 24, 2014

(54) ELECTRICAL FUSE MEMORY ARRAYS

(75) Inventors: Wei-Li Liao, Taichung (TW);
Sung-Chieh Lin, Zhubei (TW);
Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/278,686

(22) Filed: Oct. 21, 2011

(65) Prior Publication Data

US 2013/0100756 A1 Apr. 25, 2013

(51) Int. Cl.
*G11C 17/16* (2006.01)

(52) U.S. Cl.
USPC .......................... 365/225.7; 365/148; 365/187

(58) Field of Classification Search
USPC ........................ 365/225.7, 148, 187
See application file for complete search history.

(56) References Cited

U.S. PATENT DOCUMENTS

| 4,312,046 A * | 1/1982 | Taylor ........................... 365/104 |
| 5,257,230 A * | 10/1993 | Nobori et al. ................. 365/200 |
| 5,313,426 A * | 5/1994 | Sakuma et al. ............... 365/205 |
| 5,321,286 A * | 6/1994 | Koyama et al. ............... 257/315 |
| 5,936,881 A * | 8/1999 | Kawashima et al. ......... 365/149 |
| 6,480,406 B1 * | 11/2002 | Jin et al. ........................ 365/49.1 |
| 7,092,279 B1 * | 8/2006 | Sheppard ....................... 365/154 |
| 7,724,600 B1 * | 5/2010 | Im et al. ..................... 365/225.7 |
| 7,940,548 B2 * | 5/2011 | Wang et al. ................... 365/148 |
| 2002/0036918 A1 * | 3/2002 | Hidaka .......................... 365/171 |
| 2003/0063501 A1 * | 4/2003 | Covarel et al. ............... 365/200 |
| 2005/0189613 A1 * | 9/2005 | Otsuka et al. ................. 257/529 |
| 2005/0286332 A1 * | 12/2005 | Uvieghara ................. 365/225.7 |
| 2011/0063897 A1 * | 3/2011 | Ong .............................. 365/158 |
| 2011/0317468 A1 * | 12/2011 | Terzioglu ........................ 365/96 |

* cited by examiner

*Primary Examiner* — Huan Hoang
*Assistant Examiner* — Jay Radke
(74) *Attorney, Agent, or Firm* — Lowe Hauptman & Ham, LLP

(57) ABSTRACT

A mechanism of reconfiguring an eFuse memory array to have two or more neighboring eFuse bit cells placed side by and side and sharing a program bit line. By allowing two or more neighboring eFuse bit cells to share a program bit line, the length of the program bit line is shortened, which results in lower resistivity of the program bit line. The width of the program bit line may also be increased to further reduce the resistivity of program bit line. Program bit lines with low resistance and high current are needed for advanced eFuse memory arrays using low-resistivity eFuses.

20 Claims, 8 Drawing Sheets

ELECTRICAL FUSE MEMORY ARRAYS

CROSS REFERENCES TO REPLATED APPLICATIONS

The present application is related to U.S. application Ser. No. 13/205,009, entitled "ELECTRICAL FUSE BIT CELL," filed on Aug. 8, 2011, which is incorporated herein by reference in its entirety.

FIELD

The present disclosure is related to electrical fuse (eFuse) memory arrays.

BACKGROUND

Many integrated circuits (ICs) are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as complementary metal-oxide-semiconductor (CMOS) memory, anti-fuse memory, and E-fuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM utilizes electrical fuse (eFuse).

EFuses are usually integrated into semiconductor ICs by using a narrow stripe (commonly also called a "fuse link") of conducting material (metal, poly-silicon, etc.) between two pads, generally referred to as anode and cathode. Applying a program current to the eFuse destroys (i.e. fuses) the link, thus changing the resistivity of the eFuse. This is commonly referred to as "programming" the eFuse. The fuse state (i.e., whether it has been programmed) can be read using a sense circuit common in the art of electronic memories.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1A:
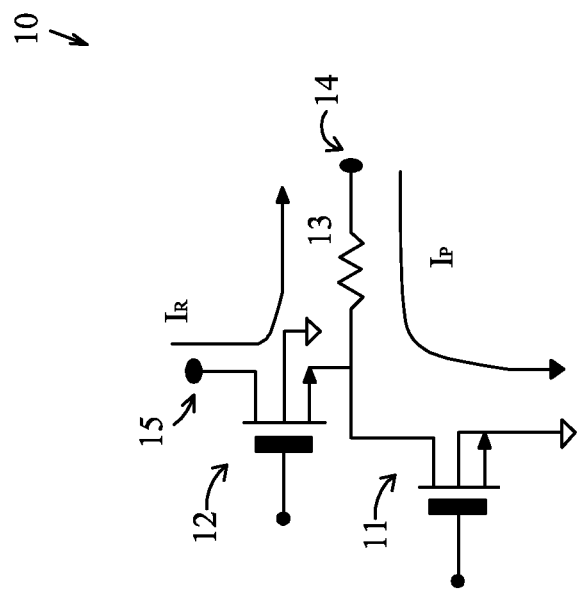
FIG. 1A is a diagram of an eFuse bit cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

FIG. 1A is a diagram of an eFuse bit cell 10, in accordance with some embodiments. EFuse bit cell 10 includes, a program transistor 11, a read transistor 12 and an eFuse 13. When eFuse 13 is not programmed (i.e. closed), the resistivity value of eFuse 13 is relatively small. In some embodiments, the closed resistivity value of eFuse 13 is about 5Ω to 200Ω. In contrast, after eFuse 13 is programmed (i.e. open), the resistance value of eFuse 13 is relatively large. In some embodiments the open resistivity value of eFuse 13 is about 1 KΩ to 100 MΩ. Node 14 is called the program node while node 15 at the drain of transistor 12 is called the read node.

In a program operation, read transistor 12 is turned off and is therefore electrically disconnected from eFuse 13. Program transistor 11 is turned on, and a program (or programming) voltage, $V_P$ (not labeled), is applied at program node 14 at one end of eFuse 13. Program current $I_P$ flows from program node 14 through eFuse 13 and transistor 11 to ground at the source of transistor 11. As a result, eFuse 13 is programmed and has a high resistance value. In some embodiments, voltage $V_P$ may be about 1.8 V, and current $I_P$ may be about 20 mA. The operational voltage VDD (not labeled) for both transistor 11 and transistor 12 may be about 0.85 V.

In a read operation, program transistor 11 is turned off, and is therefore electrically disconnected from eFuse 13. Read transistor 12 is turned on. A read current $I_R$ is forced to read node 15 at the drain of n-type metal-oxide-semiconductor (NMOS) transistor 12, in accordance with some embodiments. Current $I_R$ flows through transistor 12, eFuse 13, and node 14. In some embodiments, current $I_R$ may be about 0.5 mA. Further, detecting a voltage value at read node 15 reveals the data stored in bit cell 10. For example, if eFuse 13 is programmed (or open), the high resistance of eFuse 13 results in a high voltage value at read node 15. If eFuse 13 is not programmed (or closed), however, the low resistance of eFuse 13 results in a low voltage value at read node 15.

In some embodiments, program current $I_P$ is larger than read current $I_R$. As a result, program transistor 11 is designed larger than read transistor 12. The size of each transistor 11 and 12 is selected based on a simulation. For example, a program current $I_P$ sufficient to break (i.e. to program) eFuse 13 is determined. The size of transistor 11 is then selected based on the determined current $I_P$. In some embodiments, transistor 11 is sized such that transistor 11 can sink the determined current $I_P$.

With respect to the read operation, a read current $I_R$ sufficient to generate a read voltage at read node 15 at the drain of transistor 12 is determined. The size of transistor 12 is then selected based on the determined read current $I_R$. In some embodiments, transistor 12 is selected such that transistor 12 can source current $I_R$.

In some embodiments, bit cell 10 is part of a memory array in which a bit line is coupled to the drains of a plurality of transistors 12. When a bit cell associated with a bit line is read, other bit cells associated with the same bit line are turned off. The turned off bit cells, however, continue to experience leakage current that affects the current on the bit line coupled to the drains of transistors 12. The size of a read transistor 12 is selected based on the requirement of the total current including the leakage current associated with the bit line.

Various embodiments are advantageous because the size of each transistor 11 and 12 is selected based on the particular program or read current, respectively. As a result, performance of bit cell 10 is optimized for each of a program and a read operation. In other embodiments, one transistor is used for both programming and reading. A large program transistor providing a large program current could be over-designed in the read operation in which the read current does not need to be as large as the program current. In some embodiments, read node 15 at the drain of read transistor 12 is connected to a read bit line, and program node 14 is connected to a program bit line of an eFuse memory array.

Figure 1B:
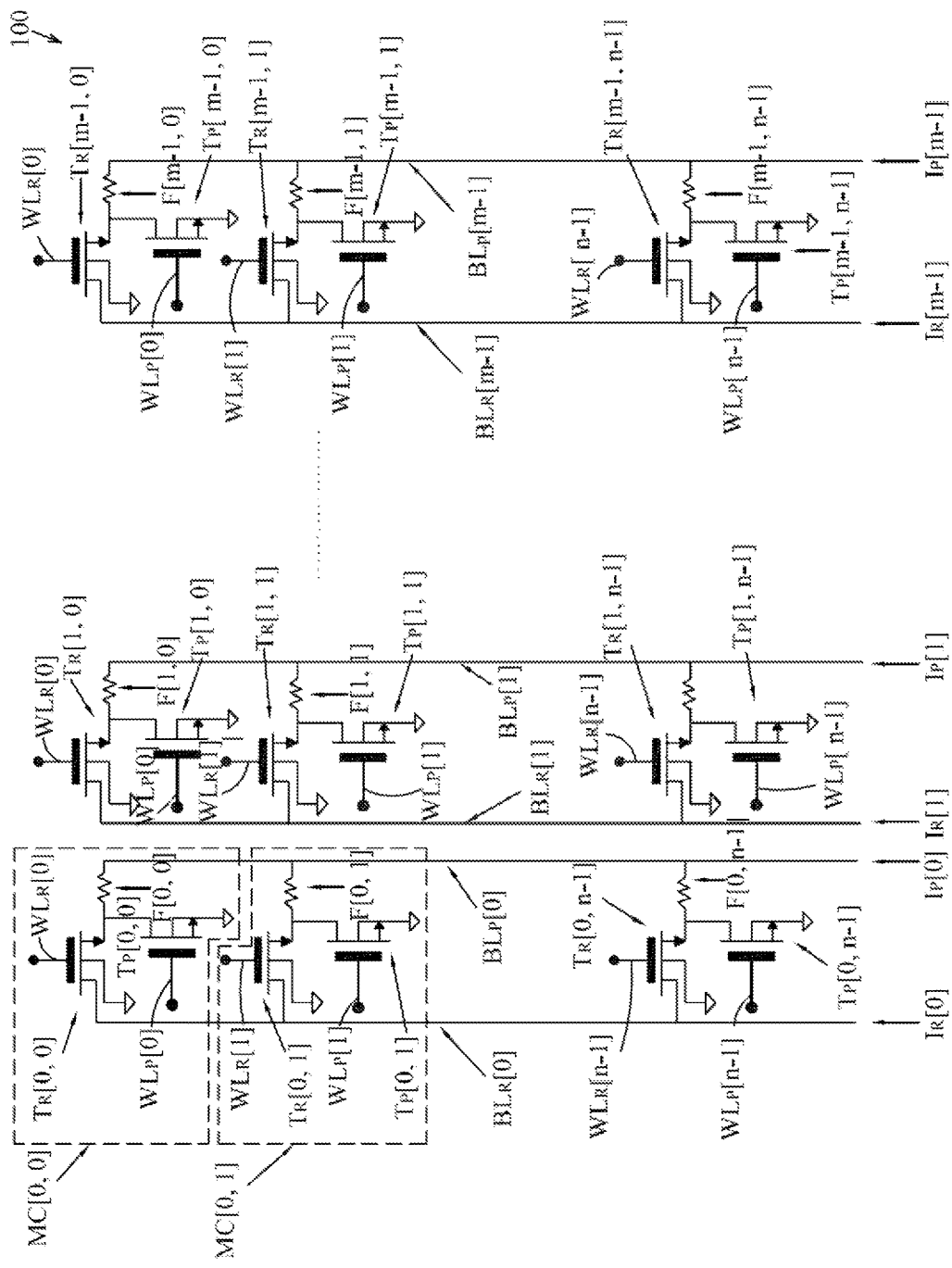
FIG. 1B shows a diagram of an eFuse memory array, in accordance with some embodiments.

FIG. 1B shows a diagram of an eFuse memory array 100, in accordance with some embodiments. Memory array 100 includes m columns and n rows of eFuse memory cells (MCs) (or bit cells), such as MC[0,0], MC[0,1], . . . , MC[m−1,n−1]. Each eFuse memory cell (MC) is associated with a program bit line ($BL_P$), such as $BL_P$[0], . . . , $BL_P$[m−1], which is used to program the eFuse memory cell, and a read bit line ($BL_R$), such as $BL_R$[0], . . . , $BL_R$[m−1], which is used to read the eFuse memory cell. For example, eFuse memory cell MC[0, 0] has $BL_P$[0] and $BL_R$[0]. Each eFuse MC is also associated with an fuse, such as F[0,0], . . . , F[m−1,n−1], a program word line ($WL_P$), such as $WL_P$[0], . . . , $WL_P$[n−1] (shown as labeled terminals at the gates of a respective row of program transistors $T_P$), and a read word line ($WL_R$), such as $WL_R$[0], . . . , $WL_R$[n−1] (shown as labeled terminals at the gates of a respective row of program transistors $T_R$). For example, eFuse memory cell MC[0,0] has eFuse F[0,0], and is connected to $WL_P$[0], and $WL_R$[0]. Each eFuse MC has a program transistor ($T_P$), such as $T_P$[0,0], . . . , $T_P$[m−1, n−1], and a read transistor ($T_R$), such as $T_R$[0,0], . . . $T_R$[m−1, n−1].

FIG. 1B shows that eFuse memory cell MC[0,0] has a program transistor $T_P$[0,0], which controls the programming of eFuse memory cell MC[0,0] and is controlled by $WL_P$[0]. When a program current $I_P$[0] is applied on $BL_P$[0], program word line $WL_P$[0] may be activated (e.g. applied with a High, or applied with a program voltage) to turn on transistor $T_P$[0, 0]. Under such circumstances, fuse F[0,0] will be programmed (or blown), which would result in high resistivity (or at a high state) of fuse F[0,0]. To be programmed, each fuse needs both the program transistor $T_P$ turned on and the program current $I_P$ being supplied. As a result, the various fuses, such as F[0,0], . . . , F[m−1, n−1], may be selectively programmed by using different combination on/off states of the program transistors and selective supplies of program current $I_P$ on different program bit lines.

After memory cells of memory array 100 have been programmed, the state of the programmed memory cells can be read. For example, MC[0,0] may be read by passing a read current $I_R$[0] along $BL_R$[0]. The eFuse memory cells described shown in FIG. 1B and described above are merely exemplary. The eFuse memory cells may be configured differently.

During programming of the fuses, such as F[0,0], . . . , F[m−1,n−1], the program transistors, such as $T_P$[0,0], . . . , $T_P$[m−1, n−1], need to drain sink the program currents, $I_P$[i], supplied at the program bit lines, $BL_P$[i], i is an integer number between 0 to m−1. As described above, the program current $I_P$ is larger than read current $I_R$. As a result, program transistor 11 is designed larger than read transistor 12.

Figure 1C:
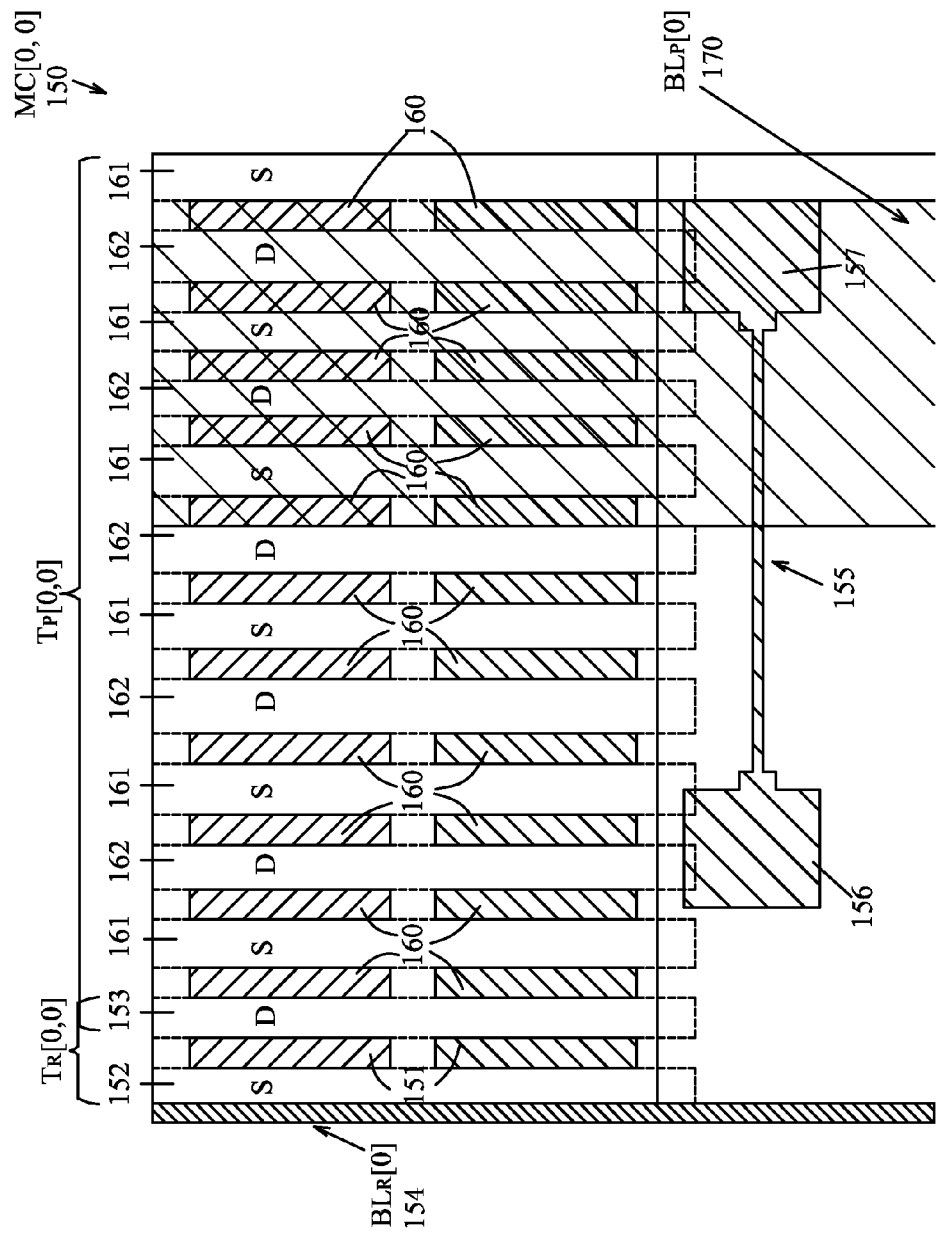
FIG. 1C shows a layout diagram of an eFuse memory cell of FIG. 1B, in accordance with some embodiments.

FIG. 1C shows a layout diagram of eFuse memory cell MC[0,0] 150 of FIG. 1B, in accordance with some embodiments. FIG. 1C shows read transistor $T_R$[0,0] having gate structures 151, a source region 152, and a drain region 153. The source region is tied to the read bit line $BL_R$[0] 154, which is a metal line, through interconnect structures, which may include contacts, metal structures, and vias (not shown). Drain region 153 of the read transistor $T_R$[0,0] is tied to a contact structure 156 of the eFuse F[0,0] 155 through interconnect structures (not shown).

The program transistor $T_P$[0,0] has a number of gate structures 160, a number of source regions 161, and a number of drain regions 162. The drain region 153 of read transistor $T_R$[0,0] is also a drain region for program transistor $T_P$[0,0]. The drain regions of $T_P$[0,0] are also tied to the contact structure 156 of eFuse F[0,0] 155 through interconnect structures (not shown). As mentioned above, the program transistor, such as $T_P$[0,0], may be designed to be larger than the read transistor, such as $T_R$[0,0] because the program current, such as $I_P$[0], is larger than the read current, such as $I_R$[0]. In some embodiments, the ratio of a total area of gate structures 160 to a total area of gate structures 151 is equal to or greater than about 8.

Transistors $T_R$[0,0] and $T_P$[0,0] described above are n-type metal-oxide-semiconductor (NMOS) field-effect transistor (FET), in accordance with some embodiments. However, the transistors may also be p-type (PMOS). The gate structures may be formed by a gate-first process or a gate-last (or replacement gate) process.

FIG. 1C shows program bit line $BL_P$[0] 170, which is also a metal structure and is wider than the read bit line $BL_R$[0] 154, which is due to $BL_P$[0] 170 being larger than $BL_R$[0] 154. The eFuse F[0,0] 155 is connected to the program bit line $BL_P$[0] 170 using interconnect structures passing through contact structure 157 of the $BL_P$[0] 170. The interconnect structures, such as vias, used to connect eFuse F[0,0] 155 to $BL_P$[0] 170 are not shown. In some embodiments, the program bit line $BL_P$[0] 170 exists in multiple metal layers to enhance the total current.

The read word line $WL_R$[0], which runs horizontally across MC[0,0] and is not shown in FIG. 1C, is connected to the gate structure 151 of the read transistor $T_R$[0,0]. The program word line $WL_P$[0], which also runs horizontally across MC[0, 0] and is also not shown in FIG. 1C, is connected to the gate structures 160 of the program transistor $T_P$[0,0].

Figure 1D:
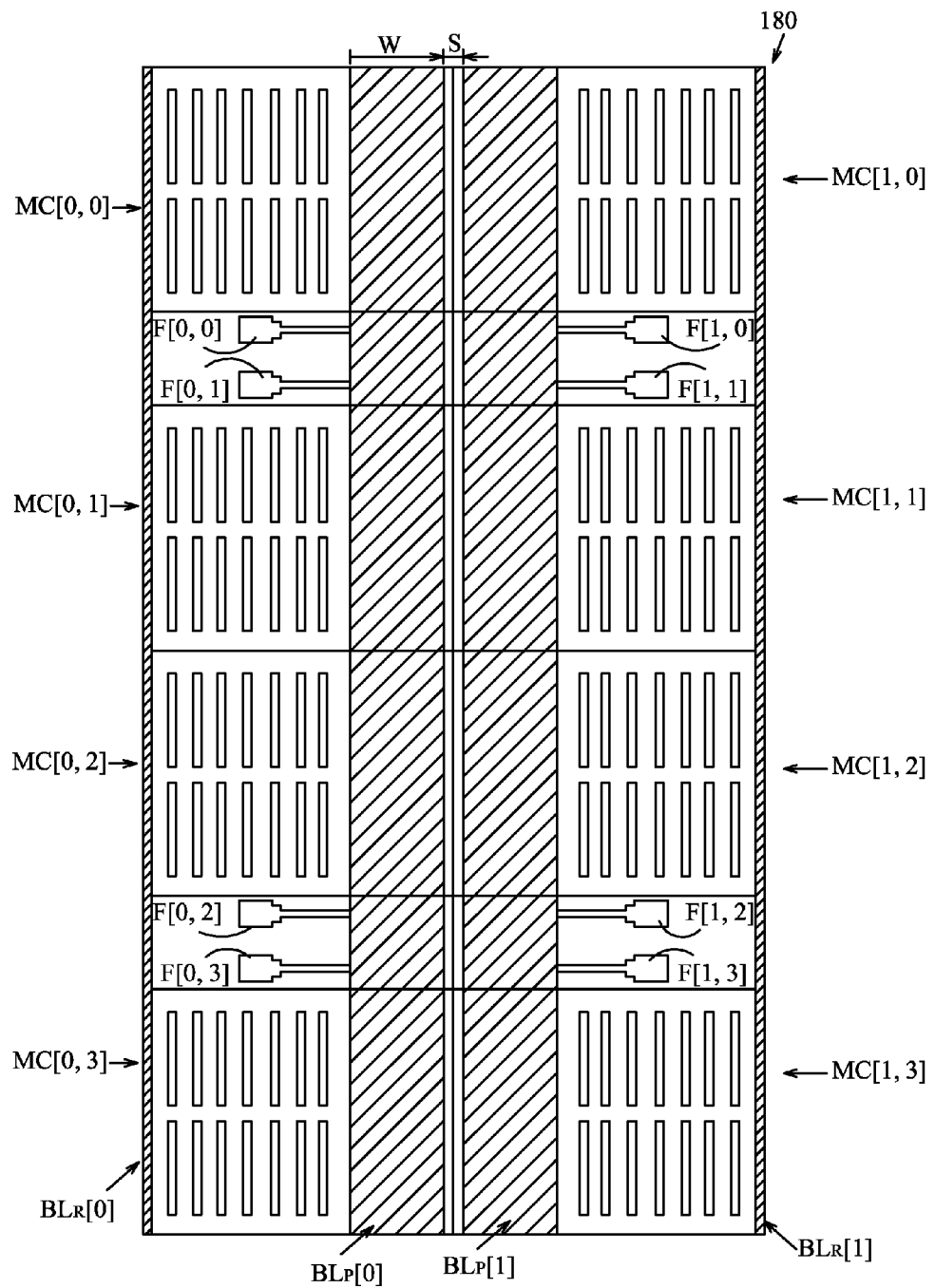
FIG. 1D shows a layout diagram of a portion of the eFuse memory array of FIG. 1B, in accordance with some embodiments.

FIG. 1D shows a layout diagram of a portion 180 of the eFuse memory array 100 of FIG. 1B, in accordance with some embodiments. FIG. 1D shows a portion of the circuit structures of the two left columns of FIG. 1B. FIG. 1D shows eFuse memory cells MC[0,0], MC[0,1], MC[0,2], MC[0,3], MC[1,0], MC[1,1], MC[1,2], and MC[1,3]. The eFuses for these memory cells are placed between the memory cells. For example, F[0,0] for MC[0,0] is placed next to MC[0,1]; and F[0,1] for MC[0,1] is placed next to MC[0,0]. FIG. 1D also shows the read bit line $BL_R$[0] and the program bit line $BL_P$[0] connecting MC[0,0], MC[0,1], MC[0,2], and MC[0,3]. Similarly, FIG. 1D shows the read bit line $BL_R$[1] and the program bit line $BL_P$[1] connecting MC[1,0], MC[1,1], MC[1,2], and MC[1,3].

As mentioned above, program bit lines, such as $BL_P$[0] and $BL_P$[1], need to carry program currents, such as $I_P$[0] and $I_P$[1], for programming the memory cells. The resistivity of program bit lines must be kept low to ensure sufficient current is carried along the program bit lines. FIGS. 1C and 1D show that the program bit lines, such as $BL_P$[0] and $BL_P$[1], are wider than read bit lines, such as $BL_R$[0] and $BL_R$[1], due to higher current carrying requirements. For example, the width W of each of the program bit lines $BL_P$[0] and $BL_P$[1] may be in a range from about 0.7 μm to about 1.2 μm, in accordance with some embodiments. In contrast, the width of the read bit line $BL_R[0]$ or $BL_R[1]$ may be in a range from about 0.05 μm to about 0.2 μm, in accordance with some embodiments.

However, some eFuses, such as metal eFuses, have lower resistivity. The current used to program such eFuses is higher than that used to program eFuses with higher resistivity, such as polysilicon Fuse (or poly-Fuse). To increase the temperature to the point required to program the low-resistivity eFuse, the program current needs to be higher for a low-resistivity eFuse than for a high-resistivity eFuse.

Figure 2A:
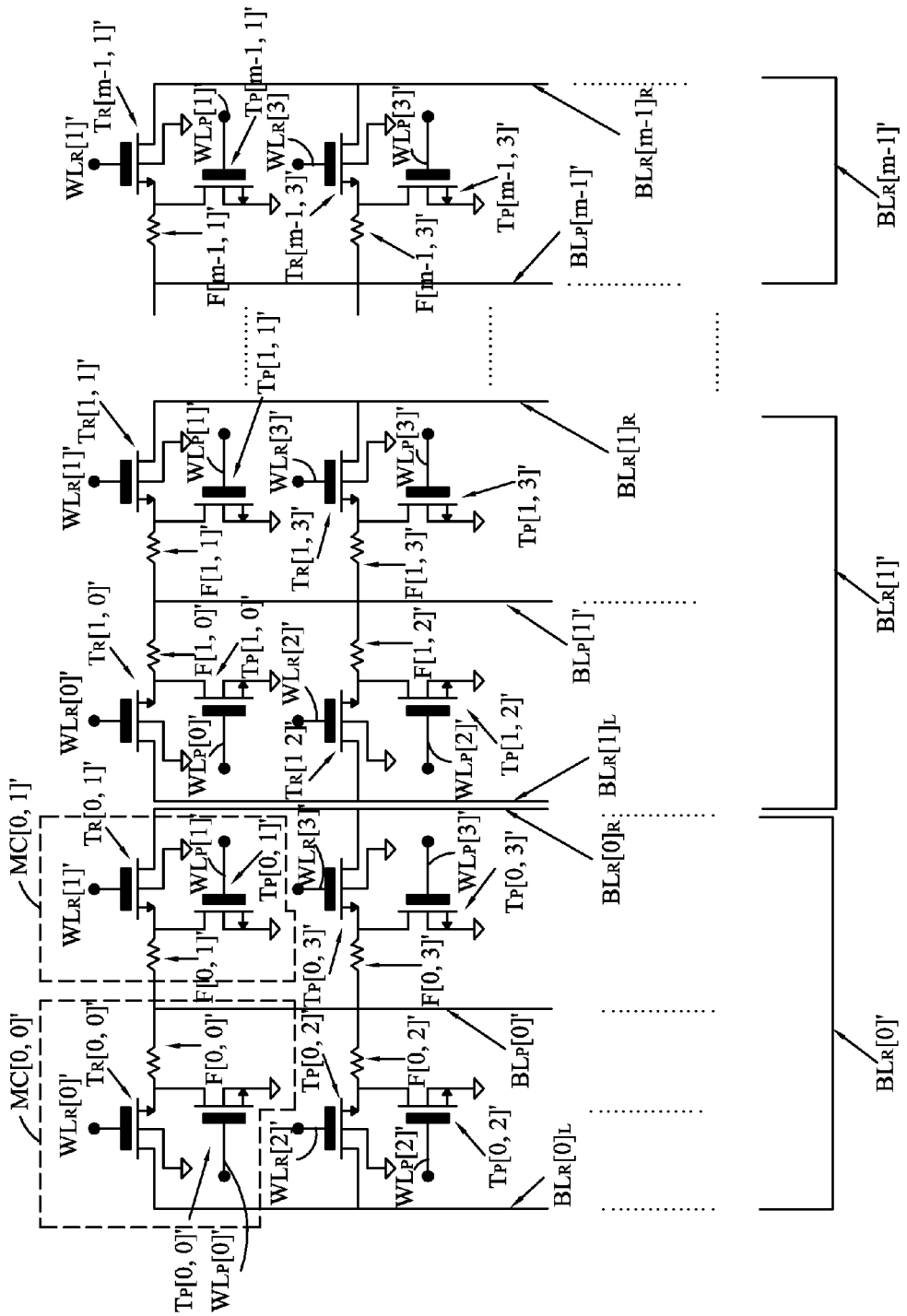
FIG. 2A shows a diagram of an eFuse memory array, in accordance with some embodiments.

FIG. 2A shows a diagram of an eFuse memory array 200, in accordance with some embodiments. Memory array 200 includes 2m columns and n/2 rows of eFuse memory cells (MCs), such as MC[0,0]', MC[0,1]', . . . , etc. The eFuse memory cells (MCs) of memory array 200 are similar in numbers to the eFuse memory cells (MCs) of memory array 100; however, they are arranged differently. For example, MC[0,1] of FIG. 1B is placed below MC[0,0] and they share the program bit line $B_{LP}[0]$ and read bit line $B_{LR}[0]$. In contrast, MC[0,0]' and MC[0,1]' are placed side by side and they share the program bit line $B_{LP}[0]$'. Similarly, MC[0,2] and MC[0,3] of FIG. 1B are re-arranged to be placed side by side as MC[0,2]' and MC[0,3]' to allow them share the program bit line $B_{LP}[0]$', as shown in FIG. 2A. The read bit line $B_{LR}[0]$ of FIG. 1B is separated into two read bit lines, $B_{LR}[0]_L$ (L after [0] for left) and $B_{LR}[0]_R$ (R after [0] for right). Similar arrangements can be made for other memory cells in column 0 of memory cells in FIG. 1B. The numbering used in FIG. 2A mirrors the numbering in FIG. 1B to better illustrate the correlation between the two figures.

Arrangements made for memory cells of column 0 described above may also be made for memory cells in other columns, such as columns 1, 2, . . . m−1 in FIG. 1B. For example, FIG. 2A shows MC[1,0] and MC[1,1] of FIG. 1B become MC[1,0]' and MC[1,1]' of FIG. 2A, which are placed side by side to share $BL_P[1]$'. Similarly, MC[1,2] and MC[1,3] of FIG. 1B are placed side by side to also share $BL_P[1]$'. In addition, read bit line $BL_R[1]$ is separated into two read bit lines, $BL_R[1]_L$ and $BL_R[1]_R$. The number of program word lines, such as $WL_P[0]', . . . WL_P[n-1]'$, stays the same as the configuration in FIG. 1B. However, the program word lines are arranged closer to one another, since the width of the space remaining for placement of program word lines is halved. In addition, the length of the program word lines is increased due to the placement of half of the memory cells in columns of FIG. 1B into additional columns in FIG. 2A. In some embodiments, the length of the program word lines of the configuration in FIG. 2A is about double the length of the program word lines of the configuration in FIGS. 1B-1D.

Figure 2B:
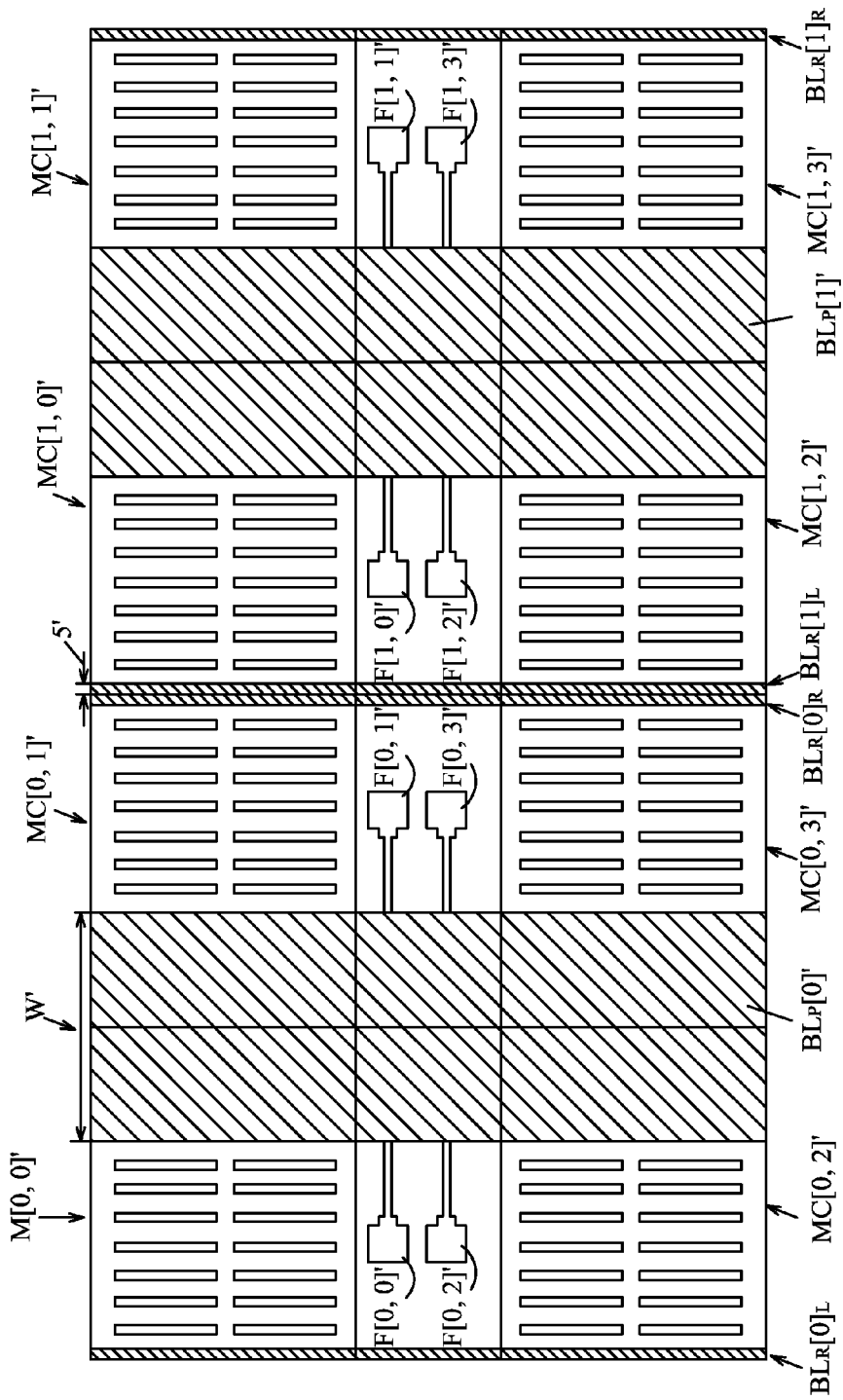
FIG. 2B shows a layout diagram of a portion of the eFuse memory array 200 of FIG. 2A, in accordance with some embodiments.

The configuration shown in FIG. 2A allows the program bit lines to be shortened to about half of the length required by the FIG. 1B arrangement. In addition, with the sharing of the program bit lines, the width of the program bit lines could be at least doubled without increasing the overall area occupied by the memory array. FIG. 2B shows a layout diagram of a portion 250 of the eFuse memory array 200 of FIG. 2A, in accordance with some embodiments. FIG. 2B shows that MC[0,0]' and MC[0,1]' are placed side by side to share the $BL_P[0]$'. In the embodiment shown in FIG. 2B, the width W' of the $BL_P[0]$' is at least double the width W of $BL_P[0]$ of FIG. 1C without increasing the total area of the eFuse memory array. In some embodiments, the width W' of the $BL_P[0]$' could be larger than twice the width W of $BL_P[0]$ of FIG. 1C.

FIG. 1D shows a space S between the column 0 and column 1 to separate neighboring transistors in different columns and also to separate neighboring program bit lines $BL_P[0]$ and $BL_P[1]$. To prevent induction effect, the space S cannot be too small. In some embodiments, the space S is in a range from about 0.1 μm to about 0.5 μm, in accordance with some embodiments. However, when MC[0,0]' is placed next to MC[0,0]' and the $BL_P[0]$' is shared, not only is the width of the $BL_P[0]$' doubled, but most of the space S can also be used to further increase the width of $BL_P[0]$'. The space S' between the neighboring read bit lines $BL_R[0]_R$ and $BL_R[1]_L$ is smaller than space S of FIG. 1C because the read bit lines $BL_R[0]_R$ and $BL_R[1]_L$ are narrower conductive lines than program bit lines $BL_P[0]$ and $BL_P[1]$. As a result, the width W' of the program bit lines of the new configuration, as shown in FIG. 2B, could be more than double the width W of the program bit lines of the old configuration, as shown in FIG. 1D.

The program current and resistance of the program bit line may depend on the technology node used to form the eFuse memory array. More advanced technology nodes may require higher current and lower resistance of the program bit line. In some embodiments, the width W' (of the program bit line) is in a range from about 1 μm to about 4 μm, in accordance with some embodiments. In some embodiments, the resistance of the program bit lines, such as $BL_P[0]', BL_P[1]', . . . BL_P[m-1]'$, is equal to or less than about 50Ω. In some other embodiments, the resistance of the program bit lines, such as $BL_P[0]', BL_P[1]', . . . BL_P[m-1]'$, is equal to or less than about 30Ω. In some embodiments, the program current is equal to or greater than about 9 mA. In some other embodiments, the program current is equal to or greater than about 12 mA. In yet some other embodiments, the program current is equal to or greater than about 30 mA. In some embodiments, the voltage drop of a program bit line is equal to or less than about 800 mV. In some embodiments, the voltage drop of a program bit line is equal to or less than about 400 mV. In some embodiments, the eFuses, such as eFuse F[0,0]', are formed of a second-level metal (or M2). In some embodiments, the program bit lines, such as $BL_P[0]$', are formed of metal structures of third-level or higher (≥M3).

Equation (1) shows the relationship between resistance (R) of a conductive line with the length (L) and cross-sectional area (A) of the conductive line. ρ is the resistivity of the material of the conductive lines $$R = \rho(L/A) \tag{1}$$

With the length(s) of the program bit line(s) halved and the width of the program bit line(s) at least doubled, the resistance of the program bit lines can be reduced to at least a quarter (or ¼) of the value of the configuration shown in FIGS. 1B-1D.

Alternatively, the width(s) of the program bit line(s) can be kept the same as the configuration shown in FIGS. 1B-1D. Under such circumstance, the resistance of the program bit lines can be reduced to about half (½) of the value of the configuration shown in FIGS. 1B-1D. The reduction of the resistance of program bit lines helps ensure sufficient current delivered to program the eFuse memory cells.

Figure 3:
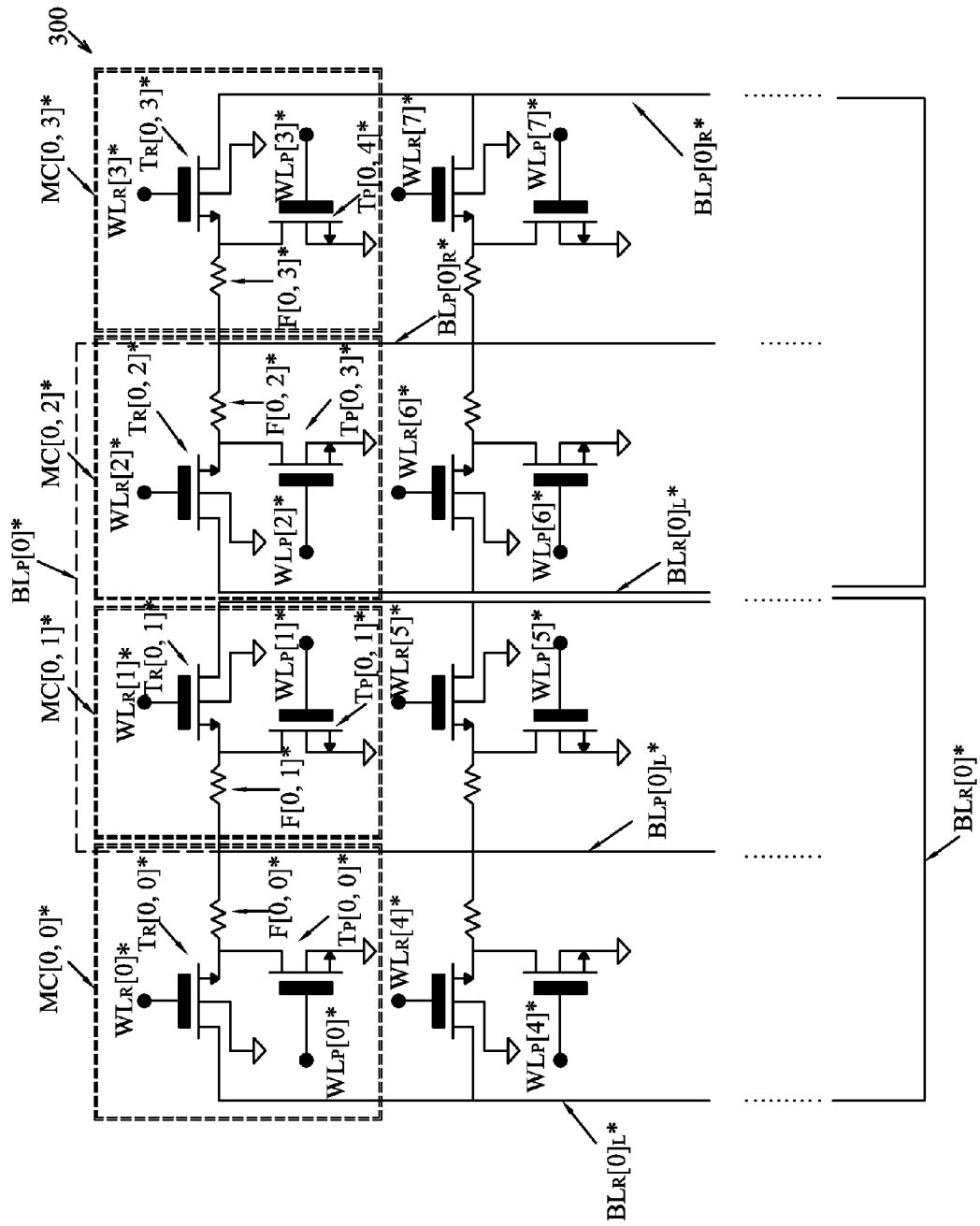
FIG. 3 shows a diagram of a portion of an eFuse memory array, in accordance with some embodiments.

FIG. 3 shows a diagram of a portion 300 of an eFuse memory array, in accordance with some embodiments. The portion 300 of the efuse array includes memory cells re-arranged from memory cells of FIG. 1B, such as MC[0,0]*, MC[0,1]*, . . . , MC[m−1,n−1]. The eFuse memory cells (MCs) of portion 300 are similar to the eFuse memory cells (MCs) of memory arrays 100 and 200; however, they are arranged differently. For example, MC[0,0], MC[0,1], MC[0,2], and MC[0,3] are placed linearly over one another, as shown in FIG. 1B, and they share the program bit line $BL_P[0]$ and read bit line $BL_R[0]$. FIG. 2B shows that MC[0,0]' and MC[0,1]' are placed side by side with MC[0,2]' and MC[0,3]' below them. As mentioned above, such placement allows the length and resistivity of the program bit lines, such as $BL_P[0]$, to be cut at least in half. FIG. 3 shows that MC[0,0]*, MC[0,1]*, MC[0,2]* and MC[0,3]* are placed side by side. MC[0,0]*, MC[0,1]*, MC[0,2]* and MC[0,3]* are all connected to a program bit line $BL_P[0]$*, which may be split into program bit lines $BL_P[0]_L$* and $BL_P[0]_R$*, which are placed between two of the four memory cells described. In some embodiments, the program bit line $BL_P[0]$* is at a different interconnect level from the program bit lines $BL_P[0]_L$* and $BL_P[0]_R$*.

Such placement of memory cells allows the length and resistivity of the program bit lines to be further reduced to at least ¼ of the arrangement shown in FIG. 1B. Similar to the arrangement described in FIG. 2B, the resistivity of the program bit lines can be further reduced by increasing the width of the program bit line. The resistivity of the program bit lines of the arrangements shown in FIGS. 2A, 2B, and 3 can be reduced to at least $1/P^2$ of the arrangement of eFuse memory cells shown in FIG. 1B, in accordance with some embodiments. P is the number of memory cells connected to the same program bit line. For example, for the configuration in FIGS. 2A and 2B, P is 2. As described above, the resistance (or resistivity) of program bit line $BL_P[0]'$ can be reduced to about ¼ (or $½^2$) of the resistance of $BL_P[0]$ due to reduction of the length and widening of the program bit line $BL_P[0]'$. Similarly, for the configuration of FIG. 3, P is 4 and the resistance of program bit line $BL_P[0]$* can be reduced to at least about 16 (or $¼^2$) of the resistance of $BL_P[0]$ due to reduction of the length and widening of the program bit line $BL_P[0]$*. In some embodiment, P is an even integer. The reduced resistance enables an increase in program current. The reduction of resistance and the increase of current in a program bit line may be achieved without increase in total area of the array. In some embodiments, the total area of the eFuse memory array may even decrease.

Figure 4:
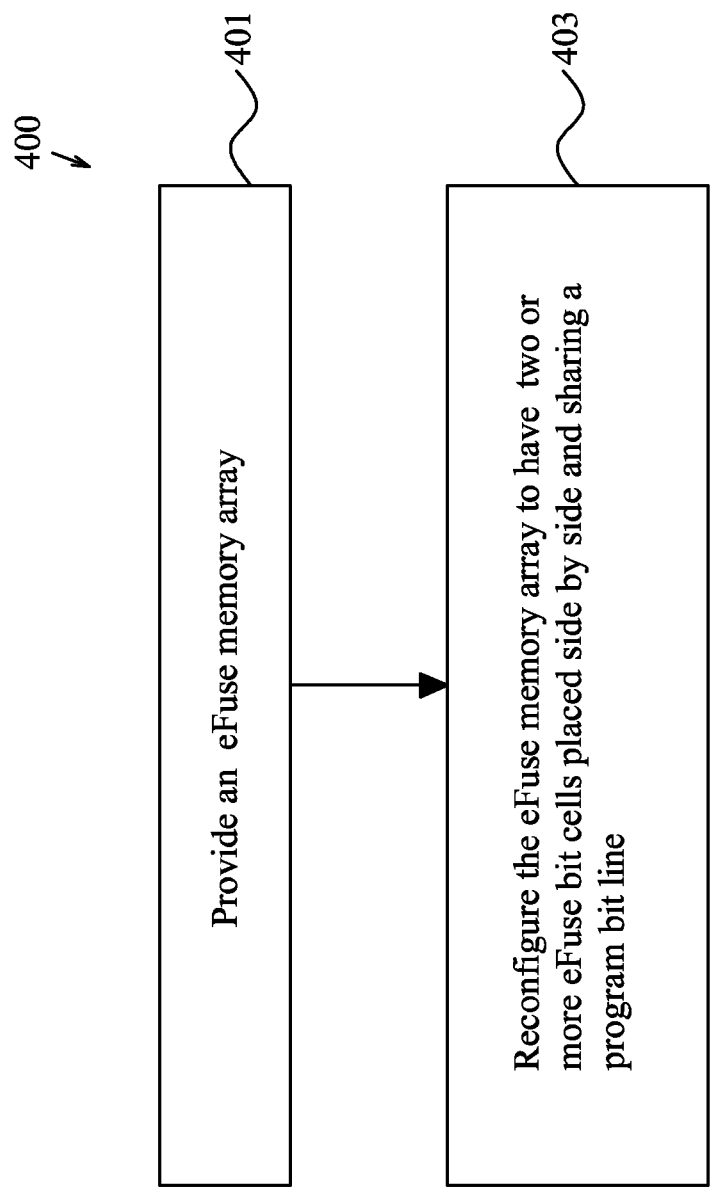
FIG. 4 shows a method of reconfiguring an eFuse memory array, in accordance with some embodiments.

FIG. 4 shows a method 400 of reconfiguring an eFuse memory array, in accordance with some embodiments. At operation 401, an eFuse memory array is provided. The eFuse memory array has eFuse bit cells in a number of rows and columns. Each eFuse bit cell has an eFuse, a program transistor, and a read transistor. An exemplary eFuse bit cell is MC[0,0], as shown in FIG. 1B. In addition, an exemplary eFuse memory array is eFuse memory array of FIG. 1B. At operation 403, the eFuse memory array is re-arranged to have two or more eFuse bit cells in a column placed side by side to share a program bit line and to reduce the number of rows. The number of rows may be reduced in half, ¼, or 1/(2×P). P is a positive integer. The length of the re-configured program bit lines may be reduced by about half, if two eFuse bit cells share the program bit line. The resistivity of the program bit line is reduced by such a reconfiguration. The program bit line may also be widened to further decrease the resistivity of the program bit line. Further details of how a re-configuration is achieved are described above. The example in FIG. 2A describes a re-configuration of an eFuse memory array having a program bit line with a length half of the length of the configuration in FIG. 1B and a width double the width of the configuration in FIG. 1B. Alternatively, the reconfiguration of the eFuse memory array can be done to have 4, 6, 8, or more eFuse bit cells sharing a program bit line.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., low or high) of the various signals used in the above description is also for illustration purposes, embodiments are not limited to a particular level when a signal is activated and/or deactivated, but, rather, selecting such a level is a matter of design choice.

The exemplary embodiments described above provide a mechanism of reconfiguring an eFuse memory array to have two or more neighboring eFuse bit cells placed side by and side and sharing a program bit line. By allowing two or more neighboring eFuse bit cells to share a program bit line, the length of the program bit line is shortened, which results in lower resistivity of the program bit line. The width of the program bit line may also be increased to further reduce the resistivity of program bit line. Program bit lines with low resistance and high current are needed for advanced eFuse memory arrays using low-resistivity eFuses. The increase in current and the decrease in resistance of the program bit line can be achieved without increase in total area of the array.

In some embodiments, an electrical fuse (eFuse) memory array is provided. The eFuse memory array includes a plurality of eFuse bit cells and each eFuse bit cell of the plurality of eFuse bit cells having a program transistor, a read transistor, and an eFuse. One end of the eFuse is connected to the program transistor and the read transistor. Another end of the eFuse is connected to a program bit line. The read transistor is connected to a read bit line. A first eFuse bit cell and a second eFuse bit cell share a first program bit line. The first program bit line is coupled to an eFuse of the first eFuse bit cell and also coupled to an eFuse of the second eFuse bit cell.

In some other embodiments, an electrical fuse (eFuse) memory array is provided. The eFuse memory array includes a plurality of eFuse bit cells and each eFuse bit cell of the plurality of eFuse bit cells having a program transistor, a read transistor, and an eFuse. One end of the eFuse is connected to the program transistor and the read transistor. Another end of the eFuse is connected to a program bit line. The read transistor is connected to a read bit line. A first eFuse bit cell and a second eFuse bit cell share a first program bit line. The first program bit line is coupled to an eFuse of the first eFuse bit cell and also coupled to an eFuse of the second eFuse bit cell. A third eFuse bit cell and a fourth eFuse bit cell share the first program bit line. The second program bit line is coupled to an eFuse of the third eFuse bit cell and is also coupled to an eFuse of the fourth eFuse bit cell.

In yet some other embodiments, a method of reconfiguring an eFuse memory array is provided. The method includes providing an eFuse memory array with a plurality of eFuse bit cells. The method also includes reconfiguring the eFuse memory array to have two or more of the plurality of eFuse bit cells in a column placed side by side. The two or more of eFuse bit cells share a program bit line.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An electrical fuse (eFuse) memory array comprising:
a plurality of eFuse bit cells, each eFuse bit cell of the plurality of eFuse bit cells having
a program transistor,
a read transistor, and
an eFuse, one end of the eFuse is connected to the program transistor and the read transistor, and another end of the eFuse is connected to a program bit line and the read transistor is connected to a read bit line,
wherein a first eFuse bit cell of the plurality of eFuse bit cells and a second eFuse bit cell of the plurality of eFuse bit cells share a first program bit line, wherein the first program bit line is coupled to an eFuse of the first eFuse bit cell and also coupled to an eFuse of the second eFuse bit cell and is positioned between the first eFuse bit cell and the second eFuse bit cell, a read bit line of the first eFuse bit cell is separate from a read bit line of the second eFuse bit cell, and the first eFuse bit cell is spaced from the second eFuse bit cell in a direction perpendicular to the first program bit line, wherein the program bit line is configured to carry a current sufficient to program the eFuse, and wherein the first eFuse bit cell need not store the logical complement of the data stored in the second eFuse bit cell.

2. The eFuse memory array of claim 1, wherein the first eFuse bit cell and the second eFuse bit cell have separate read word lines and separate program word lines.

3. The eFuse memory array of claim 1, wherein a ratio of total area of the program transistor to total area of the read transistor of each eFuse bit cell is equal to or greater than about 8.

4. The eFuse memory array of claim 1, wherein the eFuse of each eFuse bit cell is formed of metal.

5. The eFuse memory array of claim 1, wherein the program bit line connected to the eFuse of each eFuse bit cell includes a metal structure of third or higher level.

6. The eFuse memory array of claim 1, wherein a program current for the first program bit line is equal to or greater than about 9 mA.

7. The eFuse memory array of claim 1, wherein the width of the first program bit line is in a range from about 0.7 µm to about 1.2 µm.

8. The eFuse memory array of claim 1, wherein a resistance of the first program bit line is equal to or less than about 50Ω.

9. The eFuse memory array of claim 1, wherein a voltage drop of the first program bit line is equal to or less than about 400 mV.

10. The eFuse memory array of claim 1, wherein the program transistor and read transistor of the each eFuse bit cell are n-type metal-oxide-semiconductor (NMOS) transistors.

11. The eFuse memory array of claim 1, wherein the each eFuse bit cell is associated with a column and a row, and wherein a total number of columns is greater than a total number of rows for the eFuse memory array.

12. The eFuse memory array of claim 1, wherein the eFuse memory array further comprises:
a third eFuse bit cell of the plurality of eFuse bit cells and a fourth eFuse bit cell of the plurality of eFuse bit cells, wherein the first program bit line is coupled to an eFuse of the third eFuse bit cell and is also coupled to an eFuse of the fourth eFuse bit cell.

13. The eFuse memory array of claim 12, wherein the third eFuse bit cell is coupled to the read bit line of the first eFuse bit cell, and the fourth eFuse bit cell is coupled to the read bit line of the second eFuse bit cell.

14. An electrical fuse (eFuse) memory array comprising:
a plurality of eFuse bit cells, each eFuse bit cell of the plurality of eFuse bit cells having
a program transistor,
a read transistor, and
an eFuse, one end of the eFuse is connected to the program transistor and the read transistor, and another end of the eFuse is connected to a program bit line and the read transistor is connected to a read bit line, wherein
a first eFuse bit cell of the plurality of eFuse bit cells and a second eFuse bit cell of the plurality of eFuse bit cells share a first program bit line, wherein the first program bit line is coupled to an eFuse of the first eFuse bit cell and also coupled to an eFuse of the second eFuse bit cell and the first program line is positioned between the first eFuse bit cell and the second eFuse bit cell, wherein the first eFuse bit cell is spaced from the second eFuse bit cell in a direction perpendicular to the first program bit line, and at least one of a read bit line of the first eFuse bit cell is located on a first side of the first program line and a read bit line of the second eFuse bit cell is located on a second side of the first program line opposite the first program line, wherein the first eFuse bit cell is connected to a first read word line, the second eFuse bit cell is connected to a second read word line, different from the first read word line, and wherein
a third eFuse bit cell of the plurality of eFuse bit cells and a fourth eFuse bit cell of the plurality of eFuse bit cells share the first program bit line, wherein the first program bit line is coupled to an eFuse of the third eFuse bit cell and is also coupled to an eFuse of the fourth eFuse bit cell, wherein the third eFuse bit cell is spaced from the fourth eFuse bit cell in a direction perpendicular to the first program bit line, and wherein the third eFuse bit cell is connected to a third read word line, and the fourth eFuse bit cell is connected to a fourth read word line, different from the third read word line.

15. A method of reconfiguring an eFuse memory array, comprising:
providing an eFuse memory array with a plurality of eFuse bit cells;
reconfiguring the eFuse memory array to have two or more of the plurality of eFuse bit cells in a column placed side by side, wherein the two or more of eFuse bit cells share a program bit line, the program bit line located between at least one of the plurality of eFuse bit cells and at least another of the plurality of eFuse bit cells so that the two or more eFuse bit cells sharing the program bit line are on a same row spaced from one another in a direction perpendicular to the program bit line, and a read bit line of a first eFuse bit cell of the two or more eFuse bit cells is separate from a read bit line of a second eFuse bit cell of the two or more eFuse bit cells, and wherein the first eFuse bit cell need not store the logical complement of the data stored in the second eFuse bit cell.

16. The method of claim 15, wherein the reconfigured eFuse memory array has a program current at least twice a program current of the eFuse memory array prior to reconfiguration.

17. The method of claim 15, wherein two of the plurality of the eFuse bit cells in the column are placed side by side and share the program bit line.

18. The method of claim 15, wherein the width of the program bit line is re-configured to be at least twice the size of program bit line prior to reconfiguration.

19. The method of claim 15, wherein each eFuse bit cell of the plurality of eFuse bit cells having
- a program transistor,
- a read transistor, and
- an eFuse, wherein one end of the eFuse is connected to the program transistor and the read transistor, and wherein another end of the eFuse is connected to a program bit line and the read transistor is connected to a read bit line.

20. The method of claim 15, wherein a resistance of the program bit line of the reconfigured eFuse memory array is at most ¼ of the resistance of a program bit line of the eFuse memory array prior to reconfiguration.

* * * * *